United States Patent [19]
Hsu

[11] Patent Number: 6,140,681
[45] Date of Patent: Oct. 31, 2000

[54] ELECTROSTATIC DISCHARGE PROTECTION CIRCUIT

[75] Inventor: Chen-Chung Hsu, Hsinchu Hsien, Taiwan

[73] Assignee: United Microelectronics Corporation, Taiwan

[21] Appl. No.: 09/292,171

[22] Filed: Apr. 15, 1999

[51] Int. Cl.[7] .................................................. H01L 29/72

[52] U.S. Cl. ........................... 257/355; 257/360; 257/401; 257/409; 257/496

[58] Field of Search .................................... 257/355, 360, 257/401, 409, 496

[56] References Cited

U.S. PATENT DOCUMENTS 6,023,078  2/2000  Bakiga ..................................... 257/409

Primary Examiner—Edward Wojciechowicz
Attorney, Agent, or Firm—Hickman Stephen Coleman & Hughes, LLP

[57] ABSTRACT

Provided is an electrostatic discharge protection circuit according to the invention. In a drain between a gate and a contact plug which is electrically coupled to an input line, a plurality of shallow trench isolation regions are alternately formed in a shape of lattices for extending a current flow path and efficiently increasing a dissipation length. Therefore, a current caused by an electrostatic discharge can be uniformly distributed, so that the inventive electrostatic discharge protection circuit can have an enhanced protective capability.

9 Claims, 3 Drawing Sheets

ELECTROSTATIC DISCHARGE PROTECTION CIRCUIT

BACKGROUND OF THE INVENTION

1. Field of the Invention

The invention relates to an electrostatic discharge protection circuit, and in particular to an electrostatic discharge protection circuit with a shallow trench isolation (STI) structure.

2. Description of the Related Art

In or after semiconductor process for ICs, such as DRAMs and SRAMs, electrostatic discharge is usually a main factor to break down the ICs. For example, people who walk through a rug can be detected having several hundreds to thousands volts of electrostatic charges attached thereon in a higher relative humility environment, and even having more than ten thousand volts of electrostatic charges in a lower relative humility environment. When the electrostatic charges attached happen to contact a chip, the electrostatic charges can be discharged to cause the chip malfunction. In order to protect the chip against damage from an electrostatic discharge, a variety of methods has been developed. In a most common prior method, a hardware is used to prevent damage caused by an electrostatic discharge. That is, an on-chip electrostatic discharge protection circuit is designed between an internal circuit and each pad for protecting the internal circuit from damage.

Furthermore, in line with the increase of integration in semiconductor process, the thickness of a gate oxide layer is decreased. This causes the breakdown voltage of the gate oxide layer increasingly close to or even be lower than that on the junction of source/drain. Therefore, the performance of the designed electrostatic discharge protection circuit becomes much poorer. Most of internal circuits are designed based on a minimum design rule regardless of strong transient currents which could be caused by electrostatic discharges. In other words, enough spaces required between contact plugs and diffusion regions/gates, for example, are ignored in the minimum design rule. As a result, chips are easy to be damaged by electrostatic discharges in a high-integration condition. Obviously, electrostatic discharge is one of main factors to cause deep sub-micron-based ICs damage. Thus, how to enhance the performance of electrostatic discharge protection circuits is a key issue for semiconductor industry to resolve.

FIGS. 1A and 1B are schematic views showing two conventional electrostatic discharge protection circuits. Referring to FIG. 1A, electrostatic charges directed to an input port INP can be discharged to ground Vss through an N-type MOS N1 transistor thereby to protect an internal circuit 10 from damage. Referring to FIG. 1B, another electrostatic discharge protection circuit is shown. In FIG. B, electrostatic charges directed to an input port INP can be discharged not only to ground Vss through an N-type MOS transistor N1, but also to a power source $V_{DD}$ through a P-type MOS transistor P1, thereby protecting an internal circuit 20 from damage.

Referring to FIG. 2, a schematic, cross-sectional view of the electrostatic discharge protection circuit of FIG. 1A is shown. In FIG. 2, the MOS transistor N1 is formed on a substrate 20 and has a drain 22, a source 24 and a gate 26, wherein the gate 26 is separated from the substrate 20 with a gate oxide layer 25 therebetween. The MOS transistor N1 and the substrate 20 are covered with an insulation layer 28. In the insulation layer 28, first contact plugs 30 and second contact plugs 32 are formed, wherein the first contact plugs 30 electrically connects the drain 22 and an input line I/P while the second contact plugs 32 electrically connects the source 24 and ground Vss.

Referring to FIG. 3, a schematic, top view of the electrostatic discharge protection circuit of FIG. 2 is shown. That is, FIG. 2 is a schematic, cross-sectional view along a dotted line I—I' of FIG. 3. In FIG. 3, solid circles labeled with reference numeral 30 represent the first contact plugs 30 while solid circles labeled with reference numeral 32 represent the second contact plugs 32. The source 24 and the gate 26 all are electrically coupled to ground Vss, and the drains 22 are electrically coupled to the input line I/P as shown in FIG. 1A. A transient current $I_1$ caused by an electrostatic discharge can be discharged to the drain 22 through the first contact plugs 30 and then to ground Vss through the second contact plugs 32.

However, when a current is unevenly turned on or there exits defects in the structure, the transient current $I_1$ caused by an electrostatic discharge will collectively flow towards specific local regions having the problems of uneven turn-on and/or detects. Therefore, a great amount of transient current will be generated in the specific local regions to cause high temperatures thereon, and even damage to the internal circuit 10. As a result, the performance of the electrostatic discharge protection circuit is greatly reduced.

SUMMARY OF THE INVENTION

In view of the above, the invention provides an electrostatic discharge protection circuit which can extend a current flow path and increase a dissipation length. Therefore, a great amount of current caused by an electrostatic discharge can be uniformly distributed, and then local regions can be prevented from high temperatures created to cause an internal circuit damage. Accordingly, the inventive electrostatic discharge protection circuit does have an enhanced circuit protection capability.

An electrostatic discharge protection circuit according to the invention is formed on a substrate and has at least one MOS transistor electrically coupled to an input port and an internal circuit. The MOS transistor has a drain, a gate and a source, wherein the gate is separated from the substrate with a gate oxide layer therebetween, and the drain and source are located on both sides of the gate. An insulation layer is formed on the gate, source and drain. A first contact plug is formed in the insulation layer and on the drain and electrically connects the drain, the input port and the internal circuit. A second contact plug is formed in the insulation layer and on the source and electrically connect the source and a potential line. In the drain between the first contact plug and the gate, a plurality of shallow trench isolation regions are alternately formed. With the structure of the above-described electrostatic discharge protection circuit, a great amount of transient current caused by an electrostatic discharge can uniformly flow through the drain, and a dissipation length is efficiently increased. As a result, the inventive electrostatic discharge protection circuit does have a greatly enhanced circuit protection performance.

BRIEF DESCRIPTION OF THE DRAWINGS

The invention will be more fully understood from the detailed description given hereinbelow and the accompanying drawings, which are given by way of illustration only, and thus do not limit the present invention, and wherein:

FIG. 2 is a cross-sectional view along a dotted line I—I' of FIG. 3;

FIG. 4 is a cross-sectional view along a dotted line II—II' of FIG. 4.

DETAILED DESCRIPTION OF THE PREFERRED EMBODIMENTS

Figure 1A:
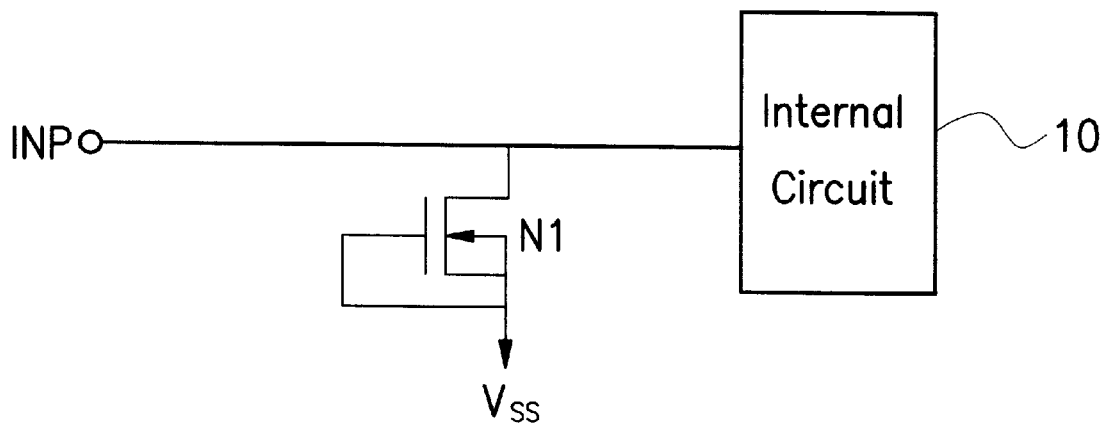
FIG. 1A is a circuit diagram illustrating an electrostatic discharge protection circuit according to a prior art.
Figure 1B:
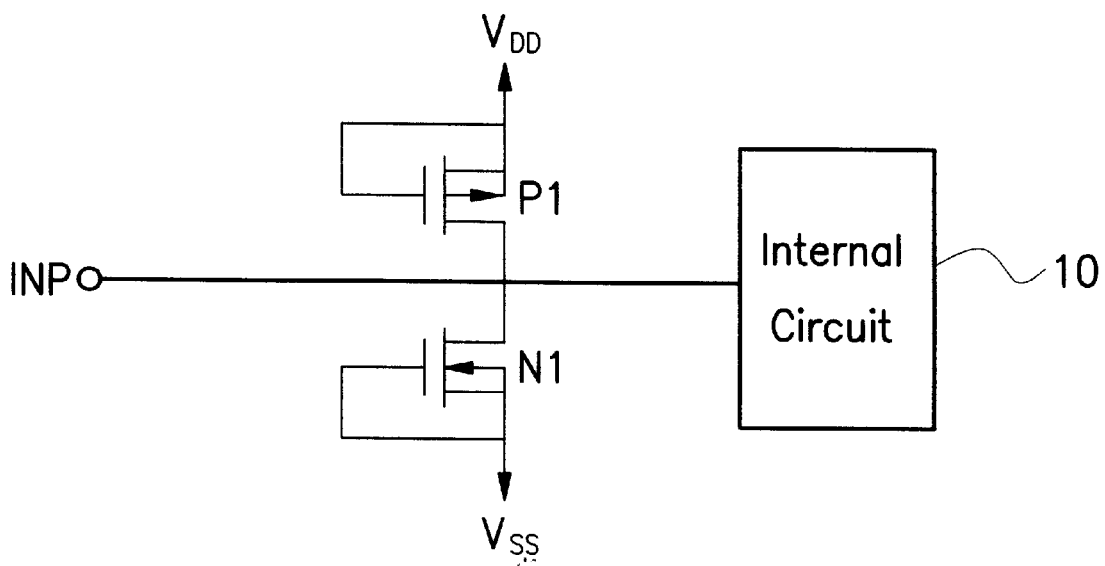
FIG. 1B is a circuit diagram illustrating another electrostatic discharge protection circuit according to a prior art.
Figure 2:
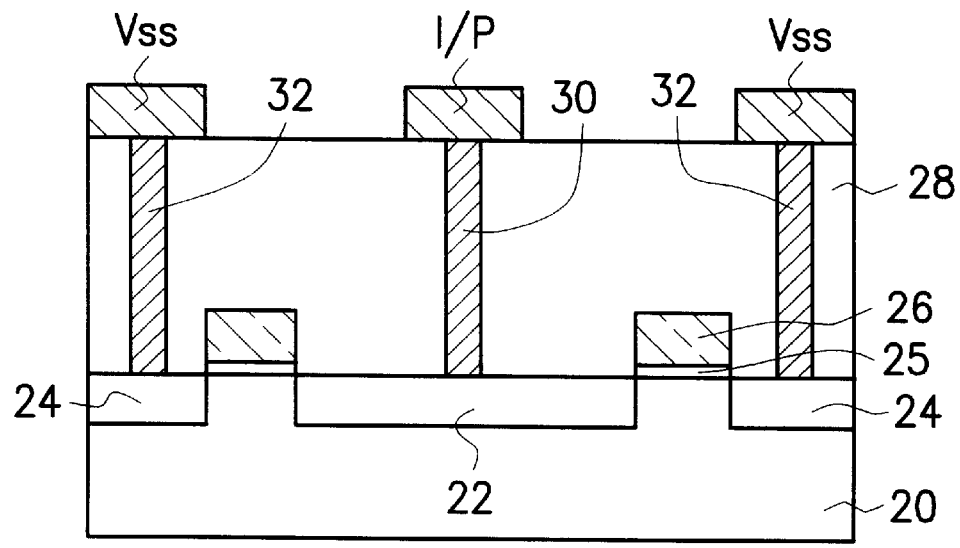
FIG. 2 is a schematic, cross-sectional view of the electrostatic discharge protection circuit of FIG. 1A.
Figure 3:
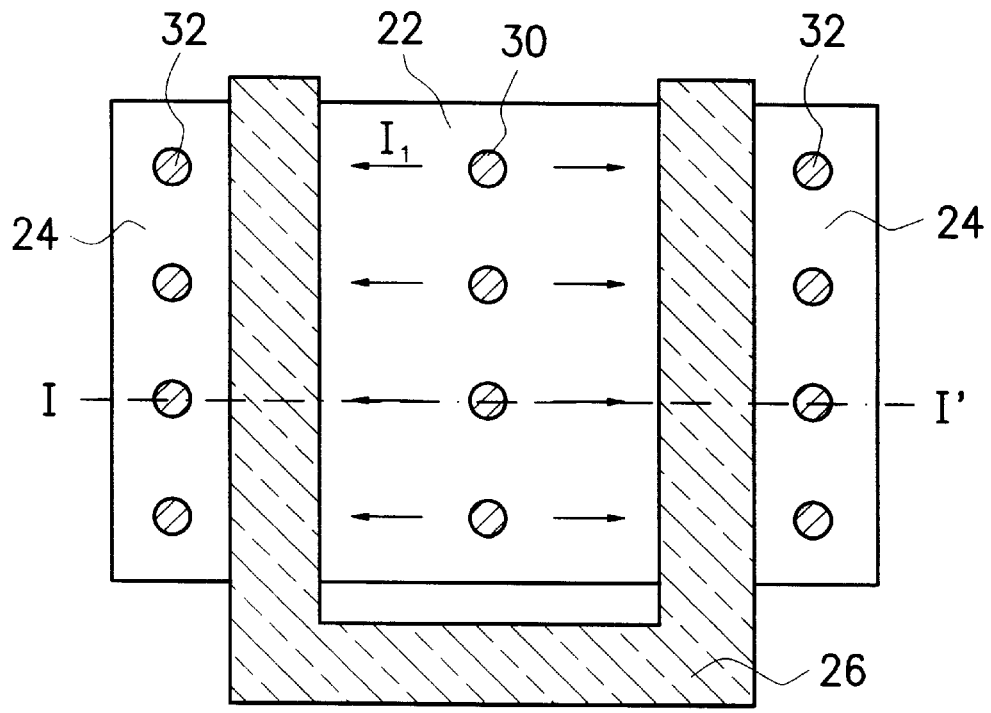
FIG. 3 is a schematic, top view of the electrostatic discharge protection circuit of FIG. 2, that is.
Figure 4:
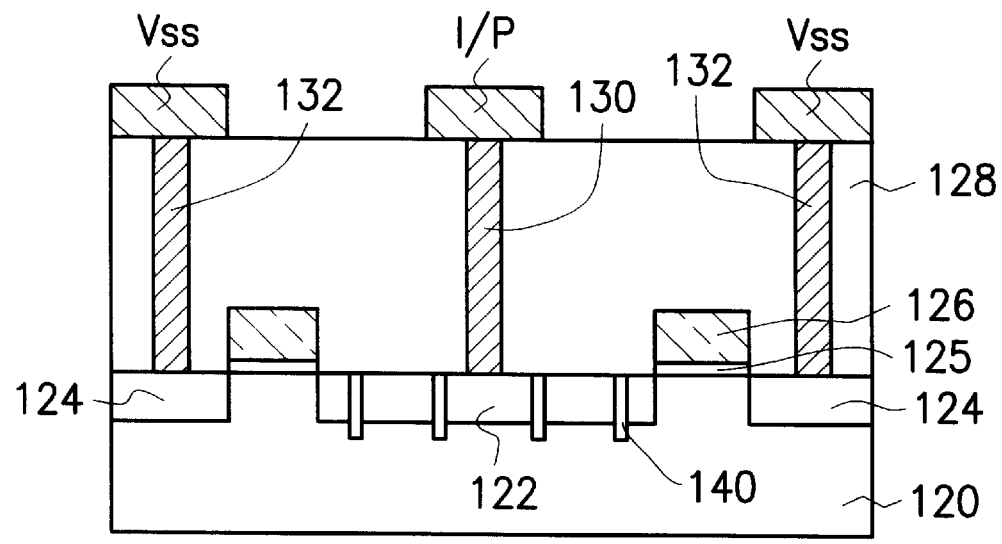
FIG. 4 is a schematic, cross-sectional view illustrating an electrostatic discharge protection circuit according to an embodiment of the invention.

Referring to FIG. 4, a schematic, cross-sectional view of an electrostatic discharge protection circuit according to a preferred embodiment of the invention is shown. In FIG. 4, a MOS transistor, such as an N-type MOS transistor, is formed on a substrate 120. The MOS transistor has a drain 122, a source 124 and a gate 126, wherein the gate 126 is separated from the substrate 120 with a gate oxide layer 125 therebetween, and the drain 122 and the source 124 are formed in the substrate 120 and on both sides of the gate 126. An insulation layer 128 is formed on the MOS transistor and the substrate 120. First contact plugs 130 are formed in the insulation layer 128 and electrically couple the drain 122 and an input line I/P, thereby electrically connecting an input port and an internal circuit (not shown) as the same as that shown in FIG. 1A. Similarly, second contact plugs 132 are formed in the insulation layer 128 and electrically couple the source 124 and a potential line, such as ground Vss. In the drain 122 between the first contact plugs 130 and the gate 126, a plurality of shallow trench isolation regions 140 which is slightly thicker than the drain 122 is alternately formed.

Figure 5:
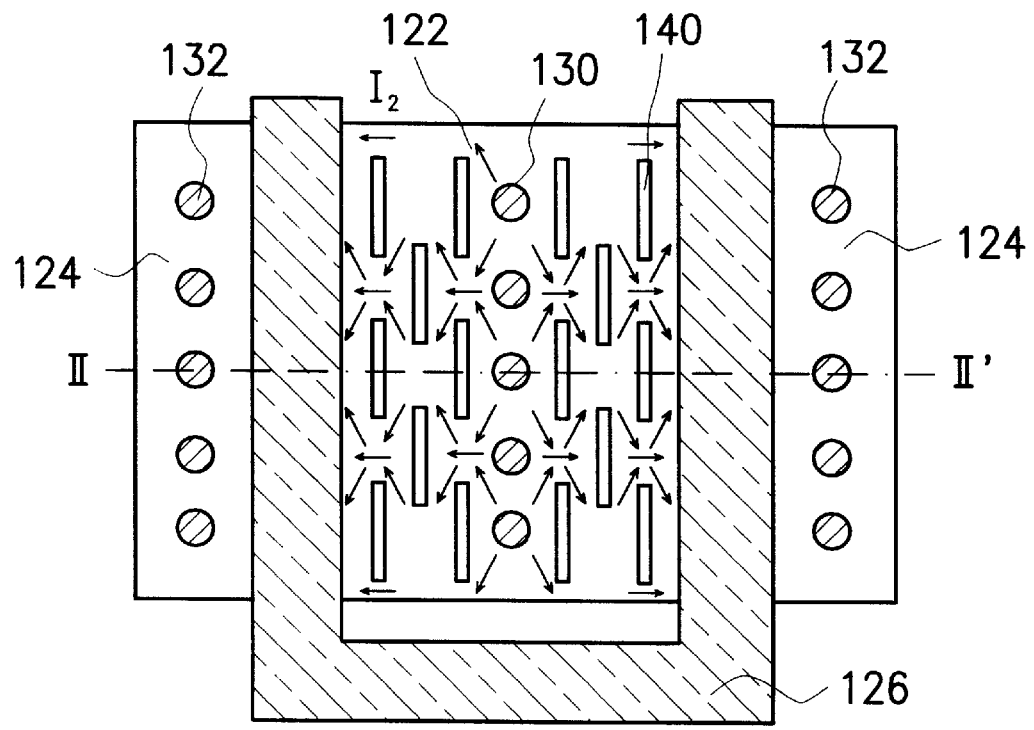
FIG. 5 is a schematic, top view of the electrostatic discharge protection circuit of FIG.4, that is.

Referring to FIG. 5, a top view of the electrostatic discharge protection circuit of FIG. 4 is shown. In other words, FIG. 4 is a schematic, cross-sectional view along a dotted line II—II' of FIG. 5. In FIG. 5, a U-shaped portion is formed of gates 126, the drain 122 is located at the center, and the source 124 is located outside the gate 126. Furthermore, solid circles labeled with reference numeral 130 are the first contact plugs while solid circles labeled with reference numeral 132 are the second contact plugs. The distance between the first contact plugs 130 and the gate 126 is around 2–4 micrometers. The first contact plugs 130 electrically connects the drain 122 and the input line I/P while the second contact plugs 132 electrically connect the source 124 and ground Vss. The plurality of shallow trench isolation regions 140, for example, are bar shaped and alternately arranged between the first contact plugs 130 and the gate 126. A transient current $I_2$ caused by an electrostatic discharge diffuses in the drain 122 through the first contact plugs 130 as shown by arrows in FIG. 5. Due to the blockages of the alternately-arranged shallow trench isolation regions 140, the current $I_2$ only flows along the gaps among the shallow trench isolation regions 140. Therefore, the current $I_2$ can uniformly flow in the drain 122 and cannot collectively flow towards specific local regions to cause the internal circuit damage. Even though circuit designs are generally based on the minimum design rule, the shallow trench isolation regions 140 used can extend the current flow path and increase the dissipation length without increasing the sizes of the actual designed circuit. Accordingly, the inventive electrostatic discharge protection circuit does have a greatly enhanced circuit protection performance.

Referring again to FIG. 5, to further improve the performance of the electrostatic discharge protection circuit, a plurality of electrostatic discharge protection circuits can be electrically connected in parallel. In this case, every two electrostatic discharge protection circuits can share source and drain therebetween. As shown in FIG. 4, the drain 122 is shared by both corresponding electrostatic discharge protection circuits, and the sources 124 and drain 122 are parallel and alternately arranged between gates 126. Next, a conductive line is used to electrically connect each drain and the input line I/P while another conductive line electrically connects each source and gate and ground Vss. For example, a lateral gate is electrically connected to two vertical gates as shown in FIG. 5. Except that, the other part of the electrostatic discharge protection circuit has the same structure as that of the previous one, and therefore will not be described.

Since a method for forming the inventive electrostatic discharge protection circuit is well known by those skilled in the art, the description thereof is just briefly described hereinafter. For example, in a method, the plurality of shallow trench isolation regions 140 is first formed in the substrate 120, followed by that a MOS transistor is formed. The insulation layer 128 is formed on the substrate 120. Thereafter, the contact plugs 130 and 132 are formed to electrically connect the input line I/P and ground Vss, respectively.

As can be seen from the above, the electrostatic discharge protection circuit of the invention can extend a current flow path and increase a dissipation length. Therefore, a current caused by an electrostatic discharge can be uniformly distributed and cannot collectively flow towards specific local regions to cause high temperatures thereon, and even damage to an internal circuit. Accordingly, the inventive electrostatic discharge protection circuit does have a greatly enhanced circuit protection capability.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electrostatic discharge protection circuit which is formed on a substrate, the electrostatic discharge protection circuit comprising:

a gate separated from the substrate with a gate oxide layer therebetween;

source/drain formed in the substrate and on both sides of the gate;

an insulation layer formed on the gate and the source/drain;

a first contact plug formed in the insulation layer and on the drain;

a second contact plug formed in the insulation layer and on the source; and a plurality of shallow trench isolation regions formed in the drain between the first contact plug and the gate.

2. The electrostatic discharge protection circuit as claimed in claim 1, wherein the shallow trench isolation regions are alternately arranged in a shape of lattices.

3. The electrostatic discharge protection circuit as claimed in claim 2, wherein the shallow trench isolation regions are bar shaped.

4. An electrostatic discharge protection circuit which is formed on a substrate and electrically coupled between an input port and an internal circuit, the electrostatic discharge protection circuit comprising:

a gate separated from the substrate with a gate oxide layer therebetween;

source/drain formed in the substrate and on both sides of the gate;

an insulation layer formed on the gate and the source/drain;

a first contact plug formed in the insulation layer and on the drain and electrically coupled to the input port and the internal circuit;

a second contact plug formed in the insulation layer and on the source and electrically coupled to a potential line; and a plurality of shallow trench isolation regions formed in the drain between the first contact plug and the gate.

5. The electrostatic discharge protection circuit as claimed in claim 4, wherein the shallow trench isolation regions are alternately arranged in a shape of lattices.

6. The electrostatic discharge protection circuit as claimed in claim 5, wherein the shallow trench isolation regions are bar shaped.

7. An electrostatic discharge protection circuit which is formed on a substrate, the electrostatic discharge protection circuit comprising:

a plurality of first gates arranged in one line and separated from the substrate with a plurality of first gate oxide layers therebetween;

a second gate electrically coupled to the first gates and separated from the substrate with a second gate oxide layer therebetween;

a plurality of sources/drains parallel and alternately arranged in the substrate between the gates;

an insulation layer formed on the fist gates, the sources/drains and the second gate;

a plurality of first contact plugs formed in the insulation layer and on the drains;

a plurality of second contact plugs formed in the insulation layer and on the sources; and a plurality of shallow trench isolation regions formed in the drains between the first contact plugs and the first gates.

8. The electrostatic discharge protection circuit as claimed in claim 7, wherein the shallow trench regions are alternately arranged in a shape of lattices.

9. The electrostatic discharge protection circuit as claimed in claim 8, wherein the shallow trench isolation regions are bar shaped.

* * * * *